United States Patent [19]

Kraus

[11] Patent Number: 5,461,315
[45] Date of Patent: Oct. 24, 1995

[54] HIGH VOLTAGE TRANSFORMER FOR THE CONTINUOUS MONITORING OF HIGH VOLTAGE CHARACTERISTICS IN A COMBUSTION ENGINE

[75] Inventor: Markus Kraus, Jenbach, Austria

[73] Assignee: Jenbacher Energiesystem Aktiengesellschaft, Jenbach, Austria

[21] Appl. No.: 138,806

[22] Filed: Oct. 15, 1993

[30] Foreign Application Priority Data

Dec. 11, 1992 [DE] Germany .......................... 92 16 908.2

[51] Int. Cl.$^6$ .......................... F02P 17/12; G01R 19/00; G01R 31/38
[52] U.S. Cl. .......................... 324/388; 324/393; 324/402; 324/126
[58] Field of Search .................... 324/119, 126, 324/132, 133, 393, 395, 399, 402

[56] References Cited

U.S. PATENT DOCUMENTS

| | | | |
|---|---|---|---|
| 3,538,440 | 11/1970 | Galloway | 324/126 X |
| 3,970,932 | 7/1976 | Harvey | 324/133 |
| 4,052,665 | 10/1977 | Gruenwald | 324/126 X |
| 4,074,193 | 2/1978 | Kohler | 324/126 |
| 4,349,782 | 9/1982 | Doss | 324/402 X |
| 4,547,734 | 10/1985 | Spaude | 324/395 |
| 5,001,432 | 3/1991 | Wixon | 324/402 |
| 5,237,278 | 8/1993 | Bumen | 324/402 X |

FOREIGN PATENT DOCUMENTS

| | | |
|---|---|---|
| 1466677 | 1/1969 | Germany . |
| 8704976 | 6/1987 | Germany . |
| 56-12459 | 9/1981 | Japan . |

OTHER PUBLICATIONS

*The Electronic Engineer & Design Magazine*, vol. 12 p. 78, Jim Rose, Apr. 1967.

Primary Examiner—Gerard R. Strecker
Attorney, Agent, or Firm—Lorusso & Loud

[57] ABSTRACT

High voltage transformer, in particular an ignition coil for a combustion engine, with a conductor section carrying a high voltage with respect to a reference potential (earth) and with at least one conductor surface in the proximity of the conductor section, and galvanically separated therefrom to which a voltage is applied, the variation of which is dependent upon the high voltage. Between the conductor surface (7, 7') and a test output (12) a non-linear electrical transmission element (13) is interconnected.

14 Claims, 4 Drawing Sheets

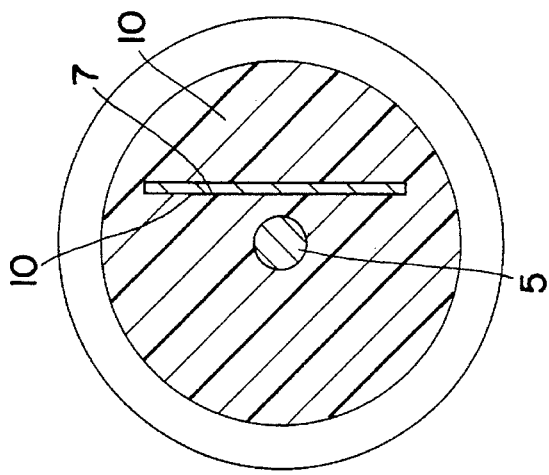
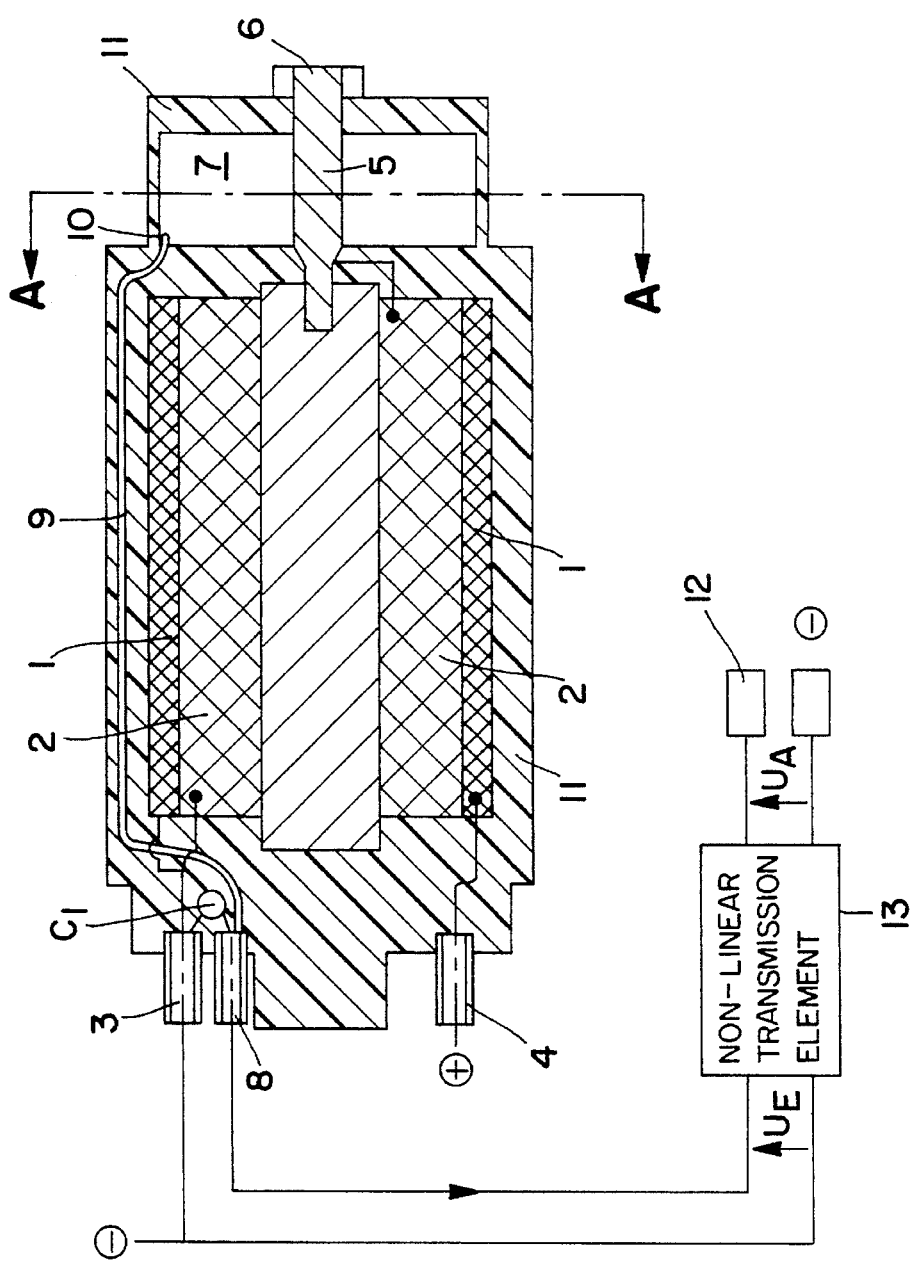

HIGH VOLTAGE TRANSFORMER FOR THE CONTINUOUS MONITORING OF HIGH VOLTAGE CHARACTERISTICS IN A COMBUSTION ENGINE

FIELD OF THE INVENTION

The invention concerns a high voltage transformer, in particular an ignition coil for a combustion engine with a conductor section carrying a high voltage with respect to a reference potential (earth), with at least one conductor surface arranged in the proximity of the conductor section and galvanically separated therefrom, and to which a voltage is applied, the variation of which is dependent upon the high voltage.

BACKGROUND OF THE INVENTION

For measurement of the high voltage supplied to a spark plug from an ignition coil via a cable, a test clip is known which can be clipped to the outer sheath of the conductor carrying the high voltage. When clipped on, two conductor surfaces of the test clip surround the high voltage cable. The conductor surfaces are located in the electrical field which surrounds the conductor section carrying the high voltage. The conductor surfaces of the test clip are connected to earth by means of a capacitor. This capacitor, together with the capacitance which is between the conductor surface and the high voltage conductor section, form a capacitive voltage divider which allows the sensing of a test circuit voltage with respect to earth from a conductor connected to the conductor surface, and which is proportional to the high voltage. The disadvantage of the known test clip is the fact that it gives different measurement results depending on the dielectric (insulating cable sheath) surrounding the high voltage cable, and the diameter thereof. In addition, dirt and inconsistent positioning of the test clip on the high voltage cable can give false measurement results. In the case of integrated ignition coils onto which a spark plug connector is directly connected without the interconnection of a cable, no measurement at all can be undertaken with the known test clip.

It has already been proposed to place a conductor surface in the proximity of the high voltage conductor section, yet galvanically separated therefrom, onto the ignition coil and thus to determine the relative positions of the conductor section and the conductor surface. However, measurements have shown that the relatively low voltage which can be sensed from the conductor surface is not a particularly accurate representation of the actual high voltage to be measured.

SUMMARY OF THE INVENTION

The aim of the invention is therefore to construct a compact high voltage transformer, in particular an ignition coil, for a combustion engine, which makes possible simple and precise measurement of the high voltage which it supplies.

This is achieved according to the invention in that between the conductor surface and a test output a non-linear electrical transmission element is interconnected.

The invention is based on the recognition that there is a non-linear relationship between the high voltage and the voltage available to the conductor surface which can be altered or corrected by the interconnection of an intentionally non-linear transmission element between conductor surfaces and test output. It is naturally particularly advantageous and desirable to have a relationship which is as linear as possible between the high voltage and the voltage picked up from the conductor surface, and thus in a preferred embodiment of the invention it is provided that the non-linear transmission element is a linearization phase which firstly compensates for the non-linear relationship between the high voltage and the voltage picked up from the conductor surfaces and provides a substantially linear relationship between the high voltage and the measured voltage at the test output.

In practice, the voltage supplied to the transmission element can be picked up by a capacitive voltage divider which is formed on the one hand by the capacitance formed between the high voltage conductor section and the conductor surfaces and on the other hand by a capacitor connected to the reference potential (earth). A preferred embodiment of the invention provides that the conductor surface(s) is (are) connected to the reference potential (earth) by means of a capacitor and a voltage sensed by the capacitor is supplied to the transmission element as an input voltage and applies the measured voltage between the test output and the reference potential (earth). It is in principle conceivable to arrange such a capacitor and the transmission element on the exterior of the high voltage transformer (ignition coil). With a view to reduced capacitive interference it is preferable however if the capacitor and the transmission element are directly attached in relation to the high voltage transformer (ignition coil).

The ignition coil according to the invention also permits the continuous monitoring and/or recording of the high voltage characteristics of a plurality of ignition coils in a combustion engine. By precise measurement the status on the one hand of the ignition coil and on the other hand of the spark plugs can be indicated, without having to switch off the combustion engine. This is of significant importance above all in the case of large, stationary combustion engines.

BRIEF DESCRIPTION OF THE DRAWINGS

Further advantages and details of the invention will be explained with the aid of the following descriptions of the figures.

FIG. 1 shows a plan view of an ignition coil of the high voltage transformer of the preferred embodiment.

FIG. 2 shows a side view of the ignition coil of the high voltage transformer of the preferred embodiment.

DETAILED DESCRIPTION OF THE INVENTION

Figure 3:
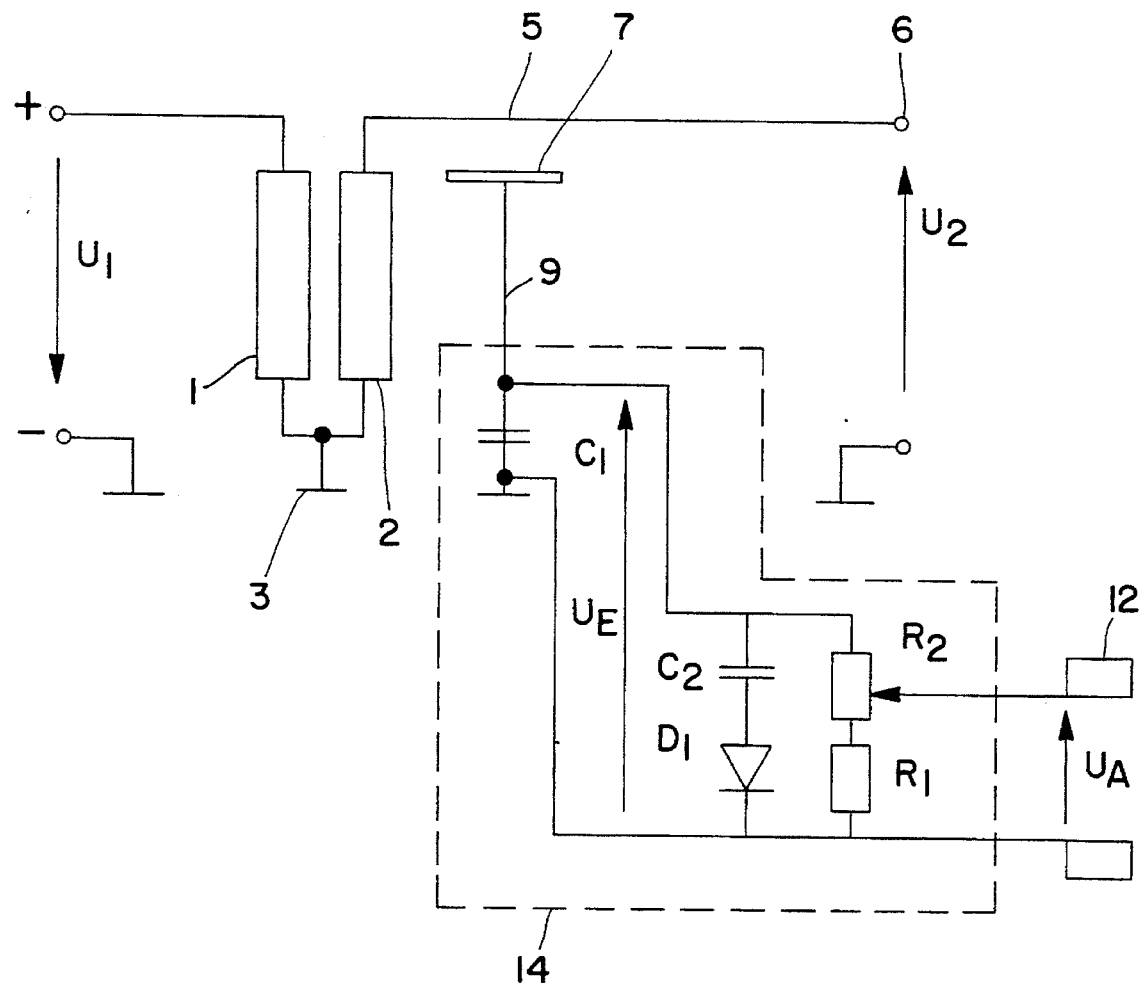
FIG. 3 shows the high voltage transformer of the preferred embodiment.
Figure 4:
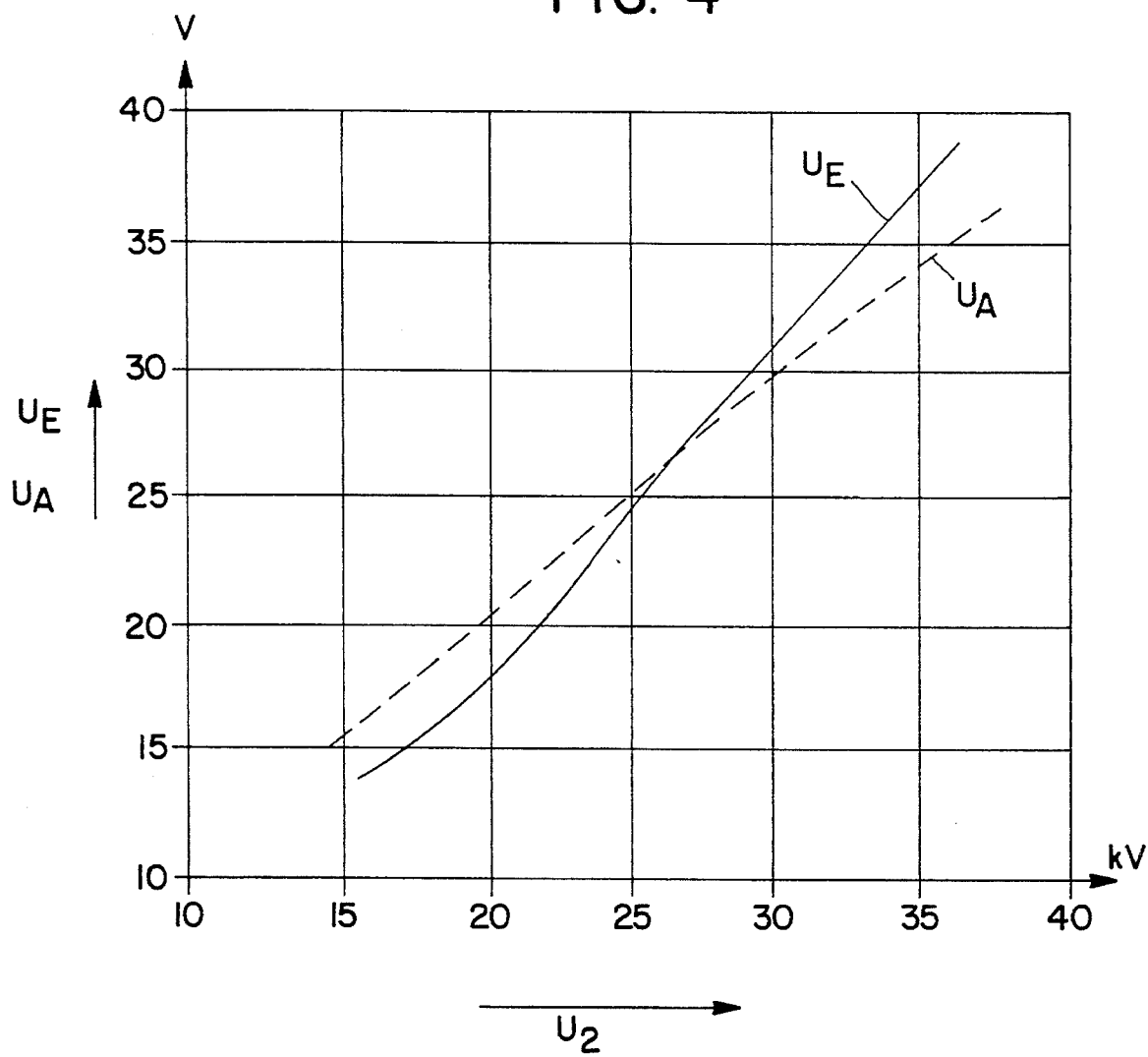
FIG. 4 graphically shows the relationship between voltages U1 and U2 as shown in FIG. 3.
Figure 5:
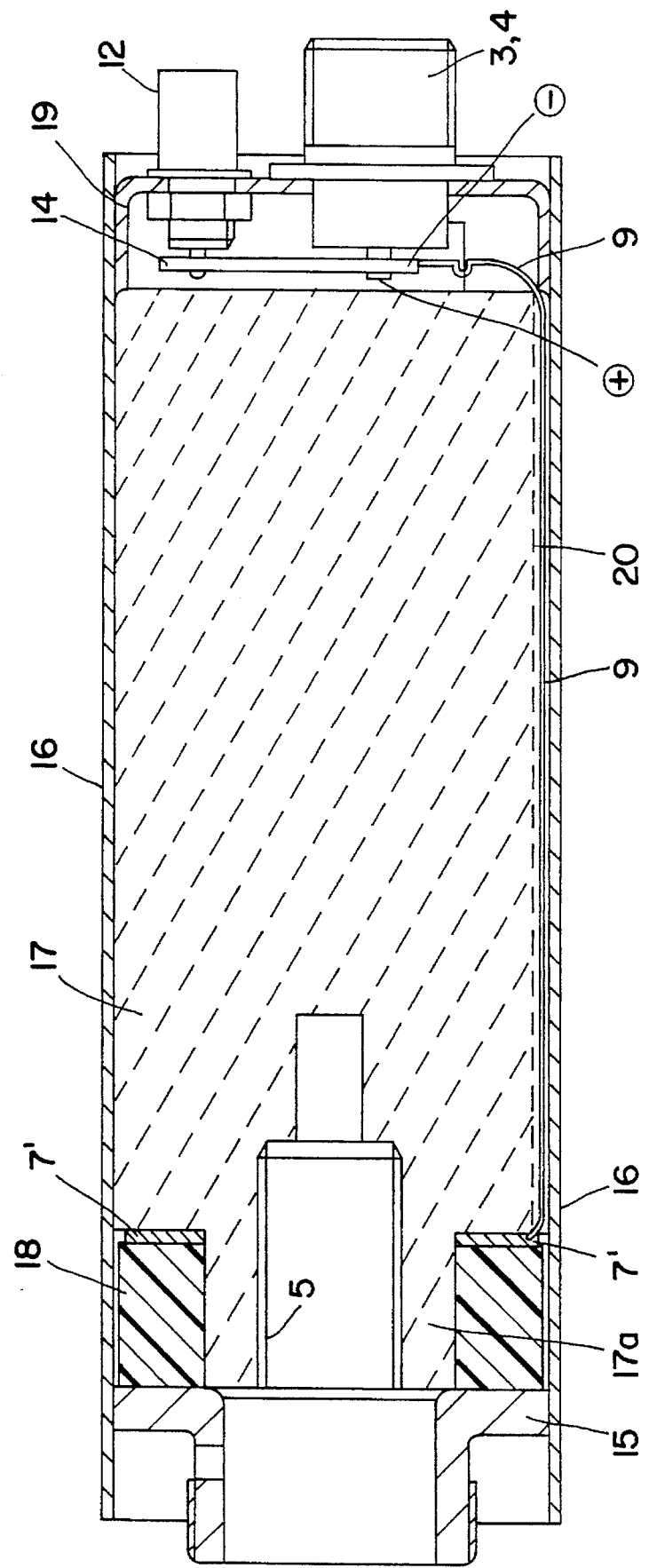
FIG. 5 shows an alternative embodiment of the ignition coil of the instant invention.

FIG. 1 shows an axial longitudinal section of an ignition coil, whereby the conductor surface lying behind the high voltage conductor section in FIG. 1 is represented in one view and the transmission element lies outside, FIG. 2 shows a section according to line A—A of FIG. 1, FIG. 3 shows an electrical circuit diagram of the ignition coil shown in FIG. 1, together with the transmission element. FIG. 4 shows the dependence of the voltage $U_E$ applied to the conductor surface and the measured voltage $U_A$ dependent upon the high voltage $U_2$, and FIG. 5 shows a further embodiment of the ignition coil according to the invention with an integrated transmission element.

The ignition coil shown in FIGS. 1 and 2, and explained in more detail in FIG. 3 is provided with a primary winding 1 and a high voltage side secondary winding 2. By means of a first connector 4 a primary voltage $U_1$ can be applied to the primary coil 1, whereby the second end of the primary coil is connected to a second connector 3 (earth connector) of the ignition coil. This earth connector is in addition connected to an end of the secondary winding 2. By means of the voltage $U_1$, a significantly higher high voltage $U_2$ is induced in the secondary winding 2 which reaches the third connector 6 (high voltage connector) of the ignition coil by means of the conductor section 5. Between this high voltage connector 6 (or the conductor section 5) and earth there is spark plug, which is not shown, for providing the required high voltage for firing the ignition spark.

In the proximity of the conductor section 5 a conductor surface 7 is arranged, which is galvanically separated therefrom, and which is installed in the ignition coil in a spatial position fixed in relation to the conductor section 5 carrying the high voltage. The ignition coil is provided with a fourth connector 8 which is electrically connected to the conductor surface 7 by means of the connecting lead 9 and the connection point 10. The conductor surface 7 is connected to the reference potential (earth connector 3) by means of the capacitor $C_1$, which likewise is installed in the ignition coil. This results in the capacitive voltage divider shown in FIG. 3 with two defined capacitances. One of these is formed by the conductor section 5 and the conductor surface 7 which is arranged in the proximity of the electrical field which surrounds the former. The other capacitance is formed by the capacitor $C_1$, the capacitance of which can, for example, be in the nano farad region. The voltage $U_E$ which varies with the high voltage $U_2$, which is preferably under 50 volts, can be measured by a high impedance voltage measuring device (for example an oscillograph with 10 M$\Omega$ and a low capacitance of, for example, 50 pF).

Tests have shown that the voltage $U_E$ which can be sensed from the conductor surface 7 or the capacitor $C_1$ is not wholly proportional to the high voltage $U_2$, but rather, for example, qualitatively demonstrates the characteristic shown by a line traced in FIG. 4. In order to linearize this characteristic, according to the invention a non-linear electric transmission element 13 is electrically interconnected between the conductor section 7 and the test output 12, which supplies an output voltage $U_A$ which, at the test output 12 has a substantially linear relationship to the high voltage $U_2$. This output voltage $U_A$ is shown by a dashed line in FIG. 4.

A possible construction of the non-linear transmission element (linearization phase) is shown in FIG. 3, whereby the components $C_2$, $D_1$, $R_1$ and $R_2$ form the non-linear transmission element. These components can be arranged together with the terminal capacitor $C_1$, on which the voltage $U_E$ can be sensed, on a common mounting plate, and, as will be explained later on using FIG. 5, accommodated directly in the ignition coil housing.

The non-linear component of the transmission element is substantially formed by the Zener diode $D_1$, which gradually becomes conductive only at a low voltage corresponding to a high voltage of about 24 kV, and thus connects the capacitor $C_2$ and the capacitor $C_1$ in parallel. This is therefore a type of two-stage linearization, which is nevertheless wholly sufficient to achieve a substantially linear relationship between the measured voltage $U_A$ and the high voltage $U_2$. It is in principle conceivable to use, in place of the Zener diode, other elements which have a voltage dependent current transmission characteristic.

On the output side, the transmission element is provided with a an adjusting device for calibration of the measured voltage $U_A$ sensed at the test output 12. In the embodiment shown, this adjusting device is formed from the resistors $R_1$ and $R_2$, whereby the resistor $R_2$ is constructed as a potentiometer. Calibration is also theoretically possible by means of an adjustable capacitor $C_1$, which can change the voltage dividing ratio of the capacitive voltage divider. However, within the desired capacitance range, finely adjustable variable capacitors are difficult to obtain, so that calibration by means of the resistors $R_1$ and $R_2$ represents the easier solution.

In the embodiment shown in FIGS. 1 and 2, the primary and secondary windings 1,2, the conductor section 5 carrying the high voltage, and also the conductor surface 7 and the capacitor $C_1$ are sealed in with a curable, electrically insulating compound, for example an epoxy resin. By also sealing in the conductor surface 7, a defined spatial position of the conductor surface 7 relative to the high voltage section 5 can be fixed during manufacture, and remains exact even under rugged operating conditions. The capacitor $C_1$ can also be protected by sealing in. It is also in principle conceivable to arrange the capacitor outside the sealed in ignition coil. A flat conductor surface of electrically conductive material, for example, a copper surface of a printed board is provided.

FIG. 5 shows a schematic drawing of a further preferred embodiment of the ignition device according to the invention, whereby the circuit board 14 which is provided with the transmission element and the capacitor $C_1$ (cf FIG. 3) is integrated into the ignition coil itself.

In contrast to the embodiment shown in FIGS. 1 and 2, the conductor surface 7' is not sealed in, but instead is pressed in. For the manufacture of the ignition coil shown in FIG. 5, an end piece 15 is welded into a metal sheath 16 which is cylindrical in form. A ring-shaped copper conductor surface 7' is pushed onto an area 17a of insulating member 17, which has a reduced diameter in comparison to the remaining insulating member 17, and subsequently a holding ring 18 of polyamide or Teflon is pushed on. Between the holding ring 18 and the end piece 15 an O ring, which is not shown, can also be provided for compensating thermal longitudinal variations. At the inside of the insulating member 17 are the primary winding and the secondary winding of the high voltage transformer (not seen in FIG. 5) which are sealed with a curable, electrically insulating component. The insulating member 17, together with the conductor surface ring 7' and the holding ring are then, from the right according to FIG. 5, pushed into the metal sheath 16, and up to the end piece 15. The electronic circuit board 14 and the cover 19 carrying the connectors 3, 4 and 12 are then pressed into, or alternatively screwed onto this. The connectors 3 and 4 are combined in a combination connector.

From the conductor surface 7' a connecting lead 9 goes into a groove 20 in the insulating member 17 of the ignition coil as far as the circuit board 14, the construction of which can, for example, correspond to that shown in FIG. 3.

The invention is not limited to the embodiments shown. For example, it can be used in another high voltage transformer as an ignition coil. The test output 8 does not have to be formed as a connecting clip on the ignition coil or the high voltage transformer. It would also be conceivable in principle that the connecting cable 9 is taken to the outside and leads into an external transmission element. In addition to the one flat and circular ring-shaped conductor surface there are clearly other conceivable and possible configurations of conductor surfaces. For example, two conductor surfaces are also possible, which seen in cross-section each form a hemispherical shape around the high voltage conductor section. In addition holding elements, which are not shown, are possible between the high voltage conductor section and the conductor surface or surfaces, which when sealed in with a curable compound fix a defined position of the conductor section relative to the conductor surface.

I claim:

1. An ignition device of a combustion engine comprising a high voltage transformer with a primary winding on which a primary voltage can be applied and a secondary winding in which a high voltage is induced by said primary voltage, a high voltage connector which is connected to said secondary winding of said high voltage transformer by means of a conductor section, a conductor surface which is arranged in the proximity of said conductor section but galvanically separated therefrom, whereby said conductor surface, is loaded to a voltage dependent upon said high voltage in said conductor section, the relationship between said voltage of said conductor surface and said high voltage being non-linear, said ignition device further comprising a linearization means, said linearization means comprising an input and an output, said input of said linearization means being connected to said conductor surface, whereby said voltage of said conductor surface is applied to said input of said linearization means, said linearization means transducing said voltage of said conductor surface to provide a linearized voltage on said output of said linearization means, such that a substantially linear relationship between said high voltage and said linearized voltage on said output of said linearization means is maintained, said output of said linearization means being connected to a measurement output, whereby said linearized voltage of said output of said linearization means is applied to said measurement output.

2. The ignition device according to claim 1, wherein said conductor surface is connected to a reference potential of ground by means of a capacitor, and a voltage sensed by said capacitor is applied to said linearization means as an input voltage.

3. The ignition device according to claim 2, wherein said capacitor and said linearization means are fixed onto or into said high voltage transformer.

4. The ignition device according to claim 3, wherein said capacitor and the components of said linearization means are arranged on the same circuit board or in said high voltage transformer, and said measurement output is arranged on said high voltage transformer.

5. The ignition device according to claim 1, wherein said linearization means comprises a capacitance which is arranged parallel to an input of said linearization means and in addition thereto in series an element with a voltage dependent forward transmission characteristic.

6. The ignition device according to claim 5, wherein said element is a Zener diode.

7. The ignition device according to claim 1, wherein said linearization means is provided with an adjusting device for calibration of the voltage on said measurement output.

8. The ignition device according to claim 7, wherein said linearization means comprises a potentiometer on the output side of said linearization means.

9. The ignition device according to claim 1 wherein said conductor surface surrounds the conductor section in a ring like manner.

10. The ignition device according to claim 9, wherein said ignition device comprises a substantially cylindrical insulating member, at the inside of which are said primary winding and said secondary winding of said high voltage transformer, which comprises an area with a diameter which is reduced in comparison to the remaining insulating member, and on which said conductor surface ring is pushed.

11. The ignition device according to claim 10, wherein a holding ring of a non-conducting material, preferably polyamide or polytetrafluoroethylene is pushed onto said area.

12. The ignition device according to claim 9, wherein the entire high voltage transformer is surrounded by a preferably cylindrical metal sheath.

13. The ignition device according to claim 12, wherein a connecting lead leads from said conductor surface between the metal sheath and said insulating member to said linearization means.

14. The ignition device according to claim 9, wherein a connecting lead leads from said conductor surface in a groove in said insulating member to said linearization means.

* * * * *